US011521927B2

(12) United States Patent
Xie et al.

(10) Patent No.: US 11,521,927 B2
(45) Date of Patent: Dec. 6, 2022

(54) BURIED POWER RAIL FOR SCALED VERTICAL TRANSPORT FIELD EFFECT TRANSISTOR

(71) Applicant: INTERNATIONAL BUSINESS MACHINES CORPORATION, Armonk, NY (US)

(72) Inventors: Ruilong Xie, Niskayuna, NY (US); Junli Wang, Slingerlands, NY (US); Choonghyun Lee, Rensselaer, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 17/093,683

(22) Filed: Nov. 10, 2020

(65) Prior Publication Data
US 2022/0148969 A1    May 12, 2022

(51) Int. Cl.
*H01L 23/528* (2006.01)
*H01L 23/532* (2006.01)
(Continued)

(52) U.S. Cl.
CPC .... *H01L 23/5286* (2013.01); *H01L 21/02532* (2013.01); *H01L 21/30604* (2013.01);
(Continued)

(58) Field of Classification Search
CPC . H01L 29/66666; H01L 29/7827–7828; H01L 29/0676; H01L 29/78642;
(Continued)

(56) References Cited

U.S. PATENT DOCUMENTS 6,492,244 B1    12/2002  Christensen
6,583,045 B1     6/2003  Liu
(Continued)

FOREIGN PATENT DOCUMENTS

CN    108231776 A    6/2018
WO    20201719921 W  8/2020

OTHER PUBLICATIONS

Prasad et al., "Buried Power Rails and Back-side Power Grids: Arm® CPU Power Delivery Network Design Beyond 5nm" International Electron Devices Meeting (IEDM), 2019, pp. 19.1.1-pp. 19.1.4, 2019 IEEE.
(Continued)

*Primary Examiner* — Younes Boulghassoul
(74) *Attorney, Agent, or Firm* — Brandon L. Stephens

(57) ABSTRACT

A semiconductor structure may include a buried power rail under a bottom source drain of a vertical transistor and a dielectric bi-layer under the bottom source drain. The dielectric bi-layer may be between the buried power rail and the bottom source drain. The semiconductor structure may include a silicon germanium bi-layer under the bottom source drain, the silicon germanium bi-layer may be adjacent to the buried power rail. The semiconductor structure may include a buried power rail contact. The buried power rail contact may connect the bottom source drain to the buried power rail. The dielectric bi-layer may include a first dielectric layer and a dielectric liner. The first dielectric layer may be in direct contact with the bottom source drain. The dielectric liner may surround the buried power rail. The
(Continued)

silicon germanium bi-layer may include a first semiconductor layer and a second semiconductor layer below the first semiconductor layer.

20 Claims, 17 Drawing Sheets

(51) Int. Cl.

| | |
|---|---|
| *H01L 29/161* | (2006.01) |
| *H01L 29/417* | (2006.01) |
| *H01L 29/06* | (2006.01) |
| *H01L 21/02* | (2006.01) |
| *H01L 21/306* | (2006.01) |
| *H01L 21/762* | (2006.01) |
| *H01L 29/66* | (2006.01) |
| *H01L 29/78* | (2006.01) |
| *H01L 21/8238* | (2006.01) |
| *H01L 21/74* | (2006.01) |

(52) U.S. Cl.
CPC ...... *H01L 21/743* (2013.01); *H01L 21/76224* (2013.01); *H01L 21/823885* (2013.01); *H01L 23/53242* (2013.01); *H01L 23/53257* (2013.01); *H01L 29/0653* (2013.01); *H01L 29/161* (2013.01); *H01L 29/41741* (2013.01); *H01L 29/66666* (2013.01); *H01L 29/7827* (2013.01)

(58) Field of Classification Search
CPC ..... H01L 21/823487; H01L 21/823885; H01L 27/2454; H01L 29/41741; H01L 21/743; H01L 21/823475; H01L 21/823871; H01L 23/5286
See application file for complete search history.

(56) References Cited

U.S. PATENT DOCUMENTS

| | | | |
|---|---|---|---|
| 7,002,187 B1 | 2/2006 | Husher | |
| 8,507,957 B2 | 8/2013 | Hou | |
| 9,570,395 B1 | 2/2017 | Sengupta | |
| 9,721,845 B1 * | 8/2017 | Cheng | ................ H01L 29/7827 |
| 9,799,655 B1 * | 10/2017 | Cheng | ..................... H01L 21/84 |
| 9,960,272 B1 * | 5/2018 | Bao | .................. H01L 29/66666 |
| 10,103,247 B1 * | 10/2018 | Xie | ....................... H01L 29/665 |
| 10,121,877 B1 * | 11/2018 | Hook | ............... H01L 29/41733 |
| 10,263,122 B1 * | 4/2019 | Zang | ..................... H01L 27/092 |
| 10,347,546 B2 | 7/2019 | Zeng | |
| 10,388,519 B2 | 8/2019 | Smith | |
| 2018/0145030 A1 | 5/2018 | Beyne | |
| 2018/0337256 A1 * | 11/2018 | Anderson | ......... H01L 29/41741 |
| 2018/0374791 A1 | 12/2018 | Smith | |
| 2019/0080969 A1 | 3/2019 | Tsao | |
| 2019/0326165 A1 * | 10/2019 | Xie | ..................... H01L 29/7827 |
| 2020/0219804 A1 * | 7/2020 | Jezewski | ............... H01L 27/124 |

OTHER PUBLICATIONS

Ryckaert, et al., "Extending the roadmap beyond 3nm through system scaling boosters: A case study on Buried Power Rail and Backside Power Delivery", Electron Devices Technology and Manufacturing Conference (EDTM), 2019, 2019 IEEE, pp. 50-52.
Notification of Transmittal of The International Search Report and The Written Opinion of the International Searching Authority, Reference No. PF210823PCT, International application No. PCT/CN2021/127100, International filing date Oct. 28, 2021, dated Feb. 7, 2022, Date of the actual completion of the international search: Jan. 25, 2022, pp. 1-9.

* cited by examiner

BURIED POWER RAIL FOR SCALED VERTICAL TRANSPORT FIELD EFFECT TRANSISTOR

BACKGROUND

The present invention relates generally to a semiconductor structure and a method of forming the same. More particularly, the present invention relates to a semiconductor structure that includes a buried power rail for aggressively scaled vertical transport field effect transistor (VTFET).

Fabricating smaller, more densely packed devices having greater computing capability is a continuing objective in building semiconductor devices. In designing semiconductor devices, each cell of the device requires power input (Vdd) and ground (Vss) connections. To power the various components, each cell is also coupled to a power rail which is electrically connected to an active layer of the cell to provide the input power (Vdd). In some instances, a plurality of power rails may be provided for each cell to respectively provide the input power (Vdd) and the ground (Vss).

SUMMARY

According to one embodiment of the present invention, a semiconductor structure is provided. The semiconductor structure may include a buried power rail under a bottom source drain of a vertical transistor and a dielectric bi-layer under the bottom source drain. The dielectric bi-layer may be between the buried power rail and the bottom source drain. The semiconductor structure may include a silicon germanium bi-layer under the bottom source drain, the silicon germanium bi-layer may be adjacent to the buried power rail. The buried power rail may be made of tungsten or ruthenium. The semiconductor structure may include a buried power rail contact. The buried power rail contact may connect the bottom source drain to the buried power rail. The dielectric bi-layer may include a first dielectric layer and a dielectric liner. The first dielectric layer may be in direct contact with the bottom source drain. The dielectric liner may surround the buried power rail. The dielectric liner may isolate the buried power rail from the dielectric bi-layer. The silicon germanium bi-layer may include a first semiconductor layer and a second semiconductor layer below the first semiconductor layer. The second semiconductor layer may be in direct contact with the first semiconductor layer. The first semiconductor layer may include 30% germanium and the second semiconductor layer may include 60% germanium. The semiconductor structure may include a third semiconductor layer. The third semiconductor layer may be directly below the bottom source drain. The third semiconductor layer may be made of silicon. The semiconductor structure may also include a top source drain, a fin, and a metal gate. The fin may be between the top source drain and the bottom source drain. The metal gate may be adjacent and in direct contact with the fin.

According to another embodiment of the present invention, a semiconductor structure is provided. The semiconductor structure may include a buried power rail under a bottom source drain of a vertical transistor, a dielectric bi-layer under the bottom source drain, and a buried power rail contact. The dielectric bi-layer may be between the buried power rail and the bottom source drain. The buried power rail contact may connect the bottom source drain to the buried power rail. The buried power rail may be made of tungsten or ruthenium. The dielectric bi-layer may include a first dielectric layer and a dielectric liner. The first dielectric layer may be in direct contact with the bottom source drain. The dielectric liner may surround the buried power rail. The semiconductor structure may include a top source drain, a fin, and a metal gate. The fin may be between the top source drain and the bottom source drain. The metal gate may be adjacent and in direct contact with the fin. The semiconductor structure may include a semiconductor layer. The semiconductor layer may be directly below the bottom source drain. The semiconductor layer may be made of silicon.

According to another embodiment of the present invention, a method is provided. The method may include epitaxially growing a silicon germanium bi-layer on a substrate, epitaxially growing a third semiconductor layer on the silicon germanium bi-layer, forming one or more vertical fins and one or more bottom source drains within the third semiconductor layer. The one or more bottom source drains may be below the one or more vertical fins. The method may include laterally etching portions of the silicon germanium bi-layer and the third semiconductor layer to form one or more first indentations, forming a first dielectric layer within the one or more indentations. The first dielectric layer may be directly below the one or more bottom source drain. The method may include laterally etching portions of the first semiconductor layer to form one or more second indentations, depositing a dielectric liner within the one or more second indentations, and forming one or more buried power rails within the one or more second indentations. The one or more buried power rails may be directly below the one or more bottom source drains. The dielectric liner may separate the one or more buried power rails from the first dielectric layer. The silicon germanium bi-layer may include a first semiconductor layer and a second semiconductor layer. The first semiconductor layer may include 30% germanium and the second semiconductor layer may include 60% germanium. The third semiconductor layer may be made of silicon. The method may include forming a shallow trench isolation between the one or more vertical fins and forming one or more bottom source drain contacts. The one or more bottom source drain contacts may connect the one or more bottom source drains with the one or more buried power rails. The shallow trench isolation may extend through the third semiconductor layer, the silicon germanium bi-layer, and a portion of the substrate. The method may also include forming one or more top source drains on top of the one or more fins, forming a metal gate between the one or more fins, forming one or more top source drain contacts, and forming one or more gate contacts.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
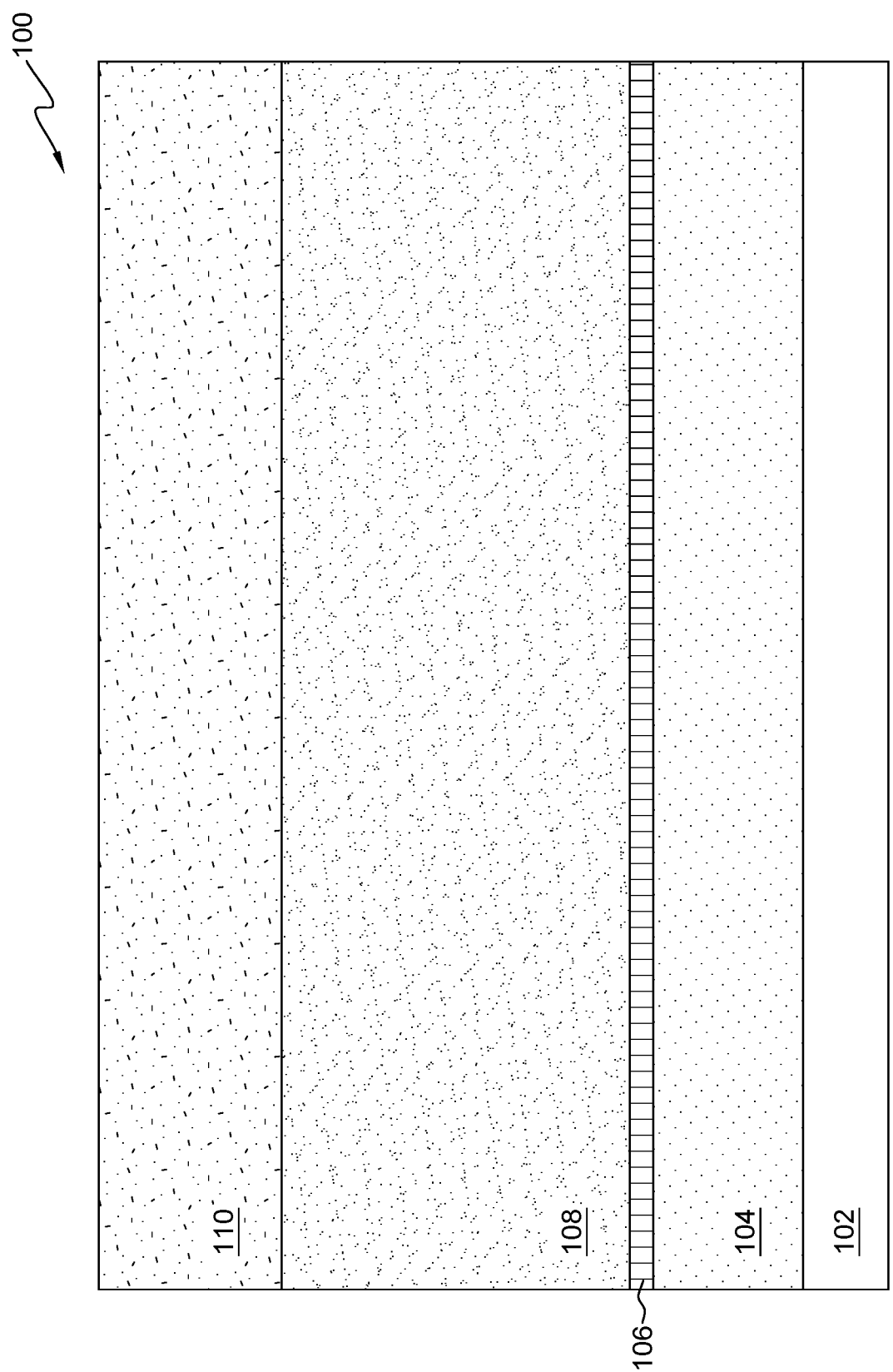
FIG. 1 is a cross section view illustrating a first and a second semiconductor layers arranged on a substrate in accordance with an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a buried power rail for aggressively scaled vertical transport field effect transistor (VTFET).

Power rails may be used in circuit to supply current to the devices. Conventionally, power rails may be stacked on top of the devices, or buried between the devices. The buried power rails are typically formed in the shallow trench isolation (STI) regions between the transistors. Currently, with aggressive cell scaling, more transistors are fabricated on the same or even smaller footprint. As a result, the space for STI also shrinks. Burying the power rails in the STI regions does not allow buried power to have adequate size to deliver the current. As such, there exists a need for a structure and a method of fabricating a power rail that not only provides current to the increased number of transistors but also fits within the scaled down footprint.

Embodiments of the present invention propose a structure and a method for fabricating a power rail that is buried directly under an active region of a transistor, thus no longer limiting the scaling of the footprint. Further, the location of the resultant buried power rail enables a bottom source drain to have a contact with that buried power rail within the active region, thus saving space within the footprint.

FIGS. 1-17 illustrate a method of fabricating the buried power rail directly below the active region of a transistor. FIGS. 13 and 16 illustrate the resultant structures of vertical transistors with buried power rails.

Referring now to FIG. 1, a structure 100 is shown, in accordance with an embodiment. The structure 100 may include a substrate 102, a first semiconductor layer 104, a second semiconductor layer 106, a third semiconductor layer 108, and a hard mask layer 110. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The first semiconductor layer 104 is epitaxially grown on the substrate 102. The second semiconductor layer 106 is then epitaxially grown on a top surface of the first silicon layer 104. The first and the second semiconductor layers 104, 106 are epitaxially grown using epitaxial growth processes, such as, for example molecular beam epitaxy (MBE).

Other methods such as rapid thermal chemical vapor deposition (RTCVD), low-energy plasma deposition (LEPD), ultra-high vacuum chemical vapor deposition (UHVCVD), atmospheric pressure chemical vapor deposition (APCVD) may also be used to grow the first and the second semiconductor layers 104, 106. The first semiconductor layer 104 may be grown to a thickness ranging between 30 nm to 200 nm. The second semiconductor layer 106 may be grown to a thickness ranging between 5 nm to 20 nm. The first and the second semiconductor layers 104, 106 may be made of silicon germanium. The germanium percentage in the first semiconductor layer 104 may be around 30%. The germanium percentage in the second semiconductor layer 106 may be around 60%. The first and the second semiconductor layers 104, 106 may collectively be referred to as a silicon germanium bi-layer or a semiconductor bi-layer.

The third semiconductor layer 108 is epitaxially grown on a top surface of the second semiconductor layer 106. The third semiconductor layer 108 may be grown using similar techniques used to grow the first semiconductor layer 104 or the second semiconductor layer 106. The third semiconductor layer 108 may be epitaxially grown to a thickness ranging between 60 nm to 150 nm. The third semiconductor layer 108 may be made of silicon.

The hard mask layer 110 is deposited on a top surface of the third semiconductor layer 108. The hard mask layer 110 may include any dielectric material such as, for example, silicon dioxide, silicon nitride and/or silicon oxynitride. In some embodiments, the hard mask layer 110 can be formed utilizing a conventional deposition process such as, for example, chemical vapor deposition, plasma enhanced chemical vapor deposition, physical vapor deposition, or atomic layer deposition. In other embodiments, the hard mask layer 110 may be formed utilizing a thermal growth process such as, for example, thermal oxidation. In yet other embodiments, the hard mask layer 110 can be formed by a combination of a deposition process and a thermal growth process. The hard mask layer 110 may have a thickness ranging from approximately 10 nm to approximately 150 nm. Other thicknesses for the hard mask layer 110 are possible and can be used in the present application.

Figure 2:
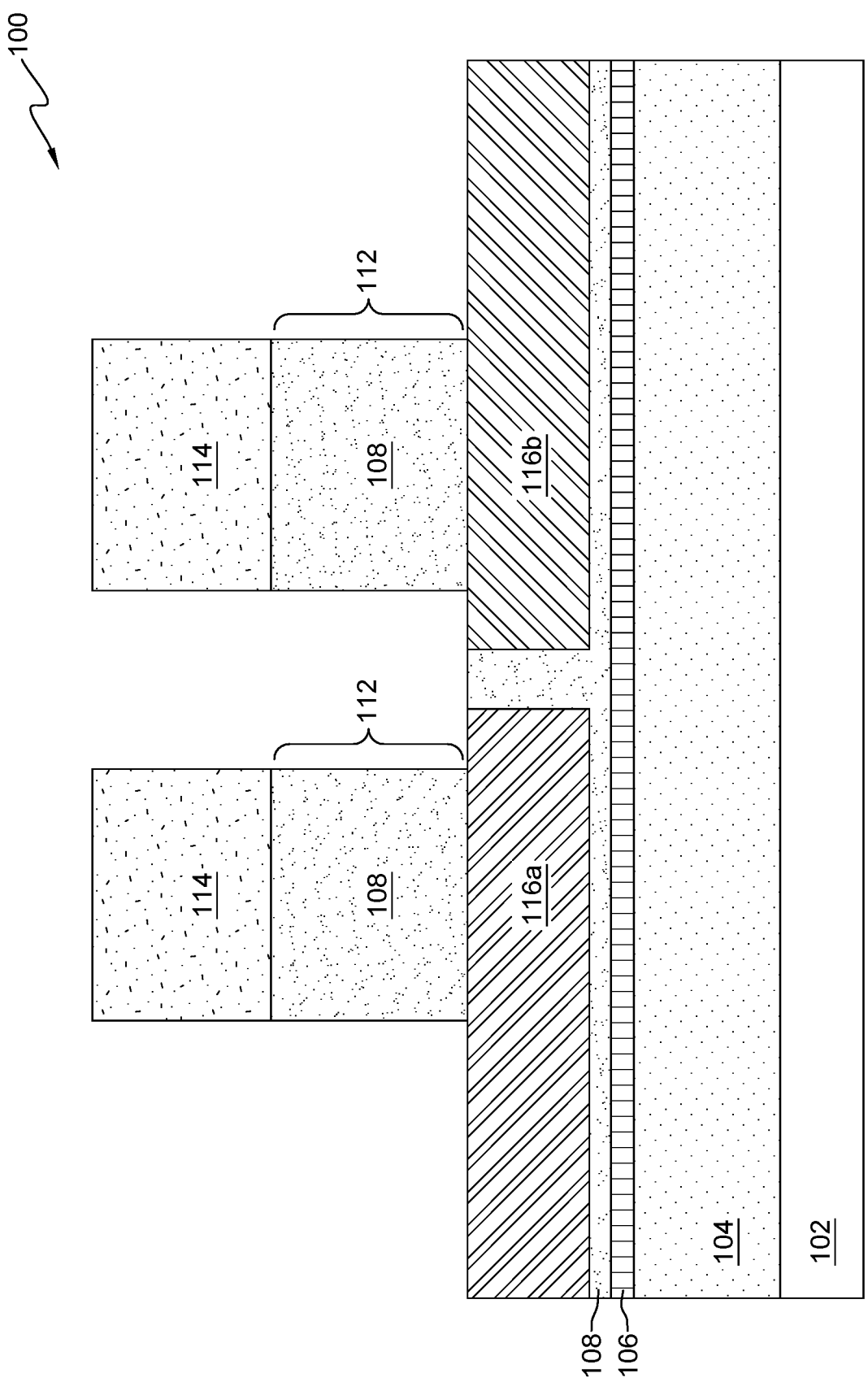
FIG. 2 is a cross section view illustrating vertical fins with bottom source drains in accordance with an embodiment.

Referring now to FIG. 2, the structure 100 with vertical fins 112 and bottom source drains 116 are shown in accordance with an embodiment. After forming the hard mask layer 110 on the top surface of the third semiconductor layer 108, the hard mask layer 110 and the third semiconductor layer 108 are patterned (not shown). Patterning may be performed by lithography and etching. The patterning of the hard mask layer 110 and the third semiconductor layer 108 results in the formation of the hard mask cap 114 and the fins 112. The fins 112 each include a pair of vertical sidewalls that are parallel or substantially parallel to each other. Although two fins 112 are described and illustrated as being formed, a single fin 112 or a plurality of fins 112 may be formed. Each fin 112 may have a vertical height ranging from approximately 20 nm to approximately 150 nm, a width from 5 nm to 30 nm, and a length from 20 nm to 300 nm. Other vertical heights and/or widths and/or lengths that are lesser than, or greater than, the ranges mentioned herein can also be used in the present application.

Once the fins 112 are patterned, the bottom source drains 116 may be epitaxially grown, using known techniques, such that the bottom source drains 116 form directly below the fins 112. The bottom source drains 116 may be in-situ doped with a p-type dopant or an n-type dopant, forming a p-type or an n-type bottom source drain for a VTFET. For example, the bottom source drains 116 may be made of silicon germanium and in-situ doped with a p-type dopant, such as, for example, boron to form a p-type bottom source drain 116a. The bottom source drains 116 may be made of silicon and in-situ doped with an n-type dopant, such as, for example, phosphorus, to form an n-type bottom source drain 116b.

Figure 3:
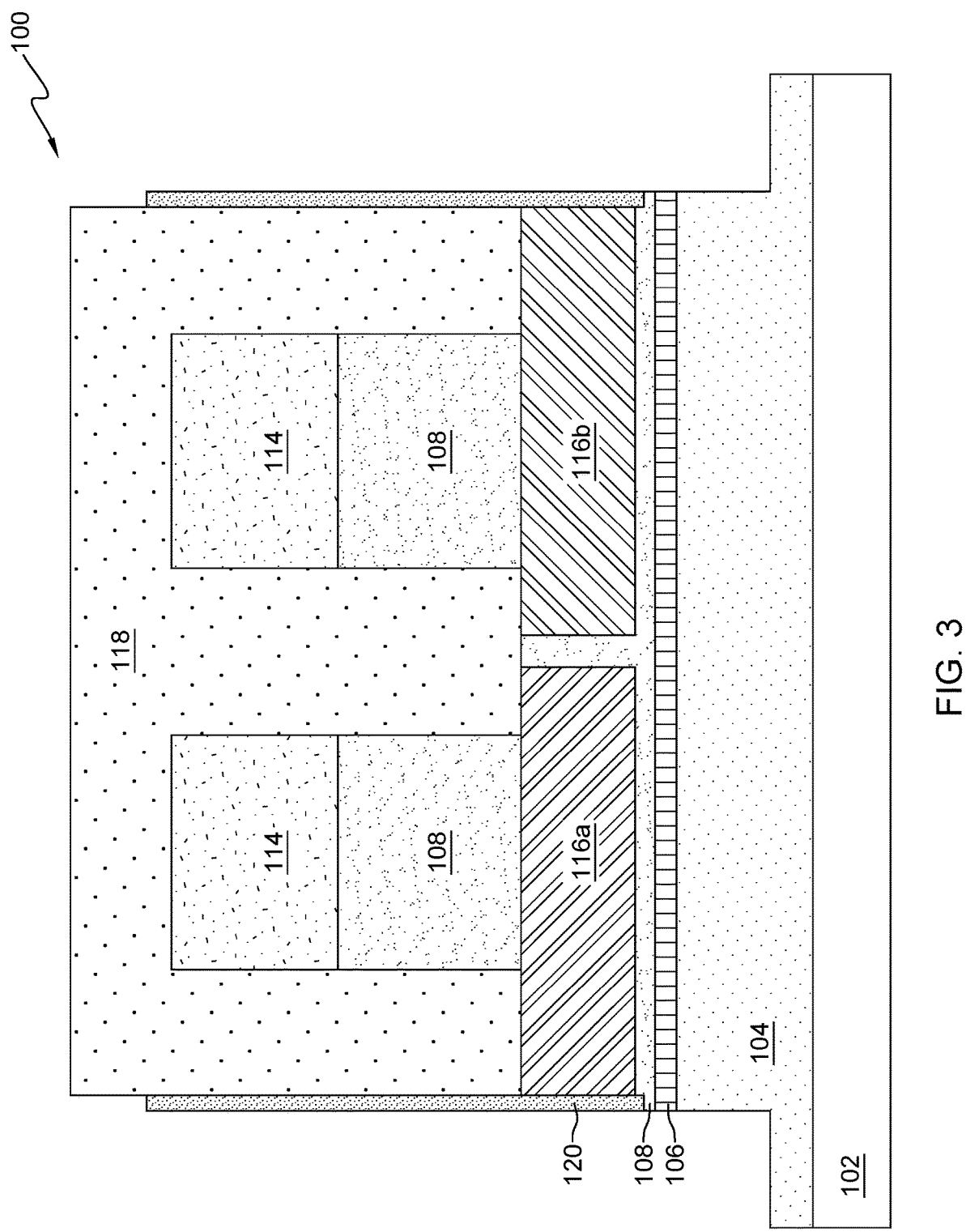
FIG. 3 is a cross section view illustrating an organic planarization layer and sidewall spacers in accordance with an embodiment.

Referring now to FIG. 3, the structure 100 with a first organic planarization layer (OPL) 118 and sidewall spacers 120 is shown, in accordance with an embodiment. The first OPL 118 is first deposited onto the top surface of the structure 100 such that a top surface of the first OPL 118 extends above a top surface of the hard mask cap 114. The first OPL 118 may be deposited using known deposition techniques, such as, for example, spin-on coating.

After the first OPL 118 is deposited, a lithography patterning and dry etch process, such as, for example, a reactive ion etch process may be used to etch the first OPL 118 such that a top portion of the third semiconductor layer 108 is exposed. The top portion of the third semiconductor layer 108 is below the bottom surface of the bottom source drains 116. A spacer layer (now shown) is then conformally deposited onto the top surface of the structure 100. The spacer layer may include an insulating material, such as, for example, silicon dioxide, silicon nitride, SiOCN, or SiBCN. Other non-limiting examples of materials for the spacer layer may include dielectric oxides (e.g., silicon oxide), dielectric nitrides (e.g., silicon nitride), dielectric oxynitrides, or any combination thereof. The spacer layer may be deposited by a deposition process, for example, atomic layer deposition, chemical vapor deposition, or physical vapor deposition. The spacer layer may have a thickness ranging from approximately 3 to approximately 15 nm, or from approximately 5 to approximately 8 nm.

Once conformally deposited, the spacer layer is then etched back to form sidewall spacers 120. To form the sidewall spacers 120, the spacer layer may be etched by a dry etch process, for example, a reactive ion etch process, such that portions of the spacer layer remain on the sidewalls of the bottom source drains 116 and the sidewalls of the first OPL 118. The sidewall spacers 120 protect the sidewalls of the sidewalls of the bottom source drains 116 and the sidewalls of the first OPL 118 from damage during subsequent manufacturing processes.

After the formation of the sidewall spacers 120, another etch process that is selective to (will not substantially remove) the sidewall spacers 120 or the first OPL 118 may be used to further recess the third semiconductor layer 108, the second semiconductor layer 106, and a portion of the first semiconductor layer 104. The etch process may be, for example, a reactive ion etch process. Recessing the third semiconductor layer 108, the second semiconductor layer 106, and a portion of the first semiconductor layer 104 exposes sidewalls of the three layers directly below the sidewall spacers 120.

Figure 4:
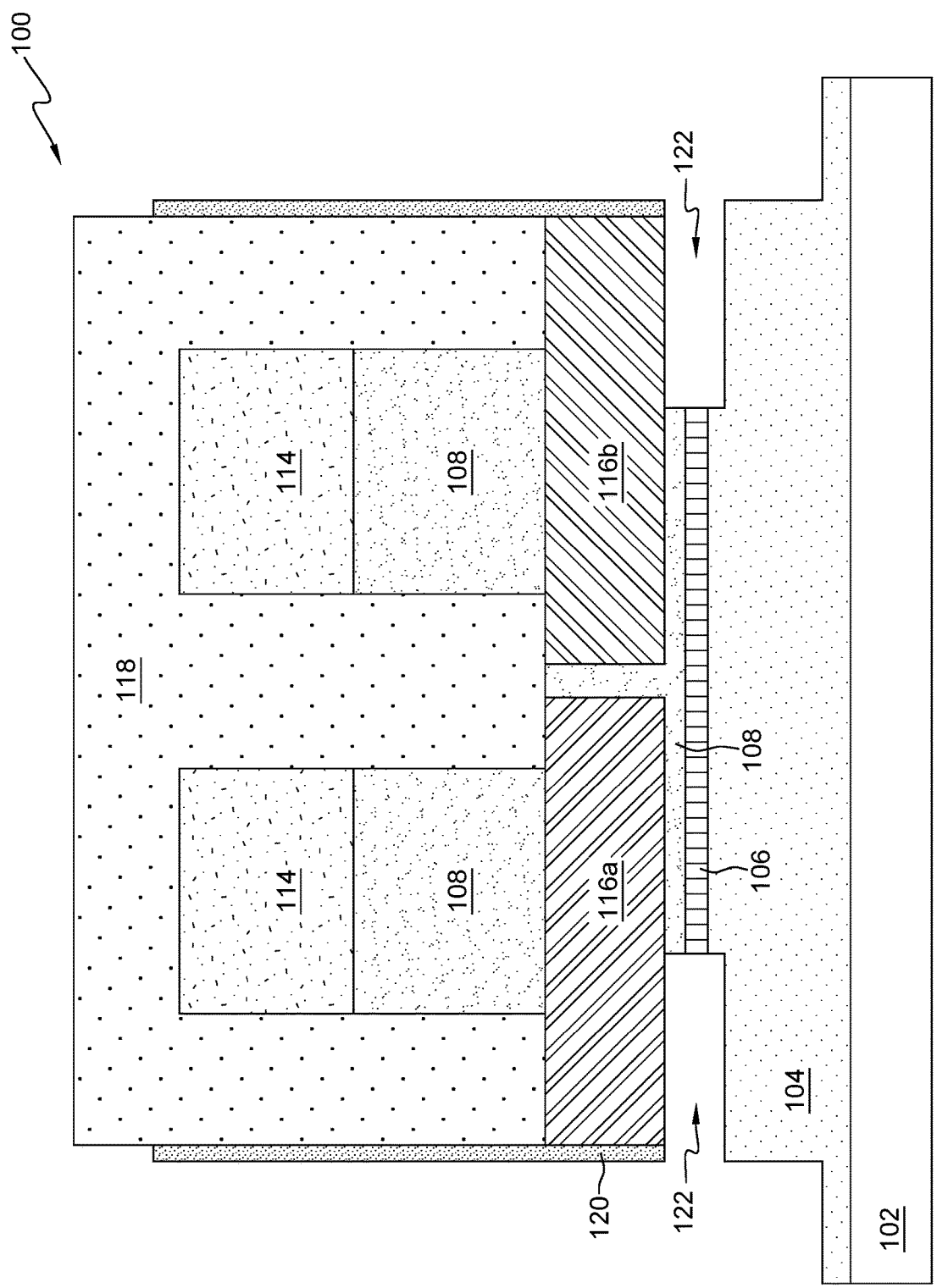
FIG. 4 is a cross section view illustrating first indentations formed by recessing the first and second semiconductor layers in accordance with an embodiment.

Referring now to FIG. 4, the structure 100 with first indentations 122 is shown, in accordance with an embodiment. The first indentations 122 are formed by first utilizing an etch process that removes the second semiconductor layer 106 selective to (will not substantially remove) the first semiconductor layer 104 and the third semiconductor layer 108. An etch process such as, for example, HCl vapor dry etch at suitable temperature may be used to laterally remove portions of the second semiconductor layer 106. As a result, portions of the second semiconductor layer 106 directly below the bottom source drains 116 are removed. Further, another etch process, such as, for example, an isotropic etch process, is used to laterally etch a top portion of the first semiconductor layer 104 and portions of the third semiconductor layer 108 such that the indentation 122 is very close to the bottom source drains 116. The formed first indentations 122 extend vertically from the bottom surface of the bottom source drains 116 to the exposed top portion of the first semiconductor layer 104.

Figure 5:
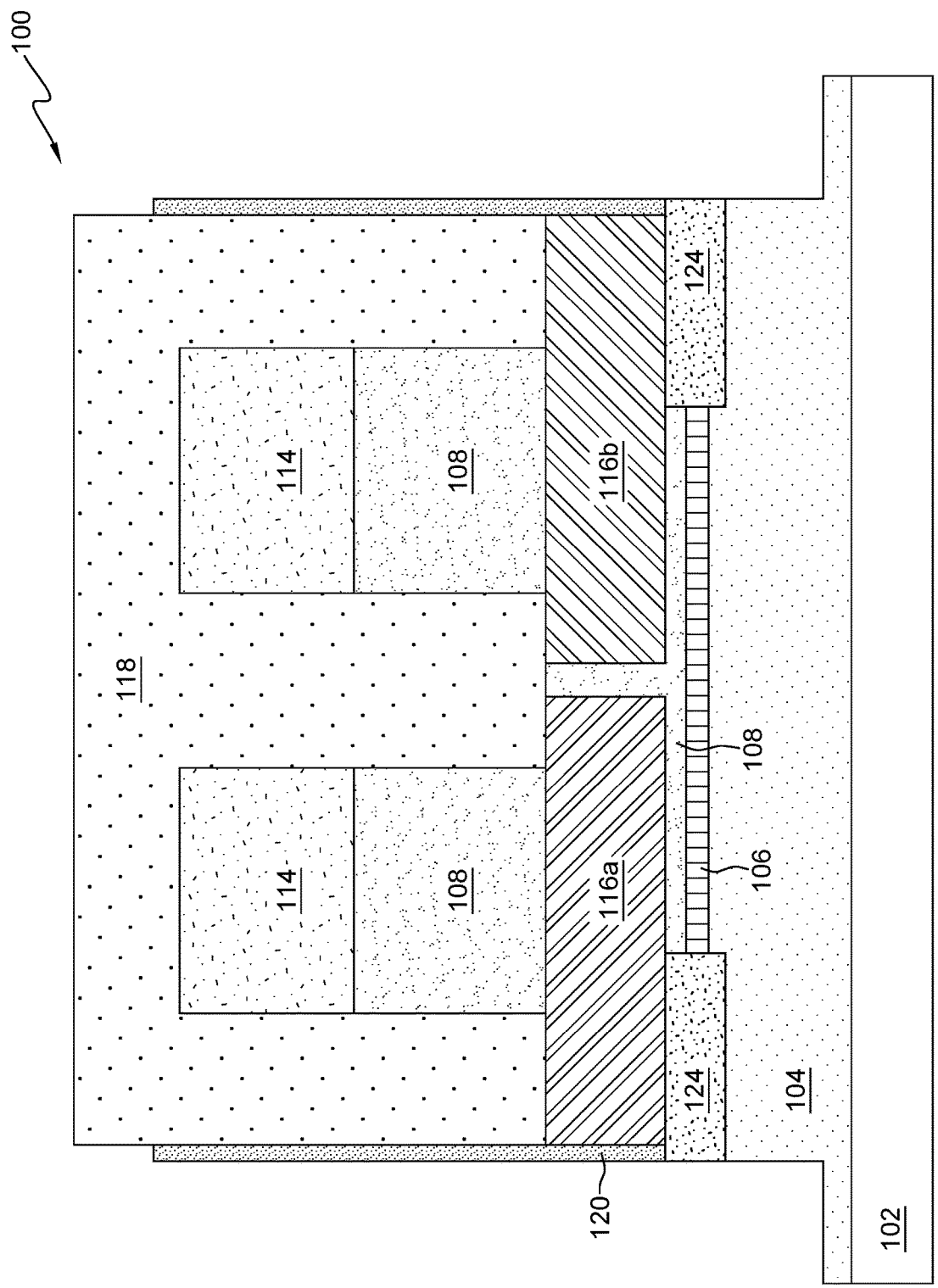
FIG. 5 is a cross section view illustrating a first dielectric layer below the bottom source drains in accordance with an embodiment.

Referring now to FIG. 5, the structure 100 with a first dielectric layer 124 below the bottom source drains 116 is shown, in accordance with an embodiment. A dielectric material may be deposited, using plasma enhanced atomic layer deposition, onto the top surfaces of the structure 100. During the deposition, the indentations 122, illustrated in FIG. 4, are filled with the dielectric material. The dielectric material may be silicon nitride. The dielectric material is then etched, using an isotropic etch process, to form the first dielectric layer 124. The first dielectric layer 124 is below and in direct contact with the bottom source drains 116.

Figure 6:
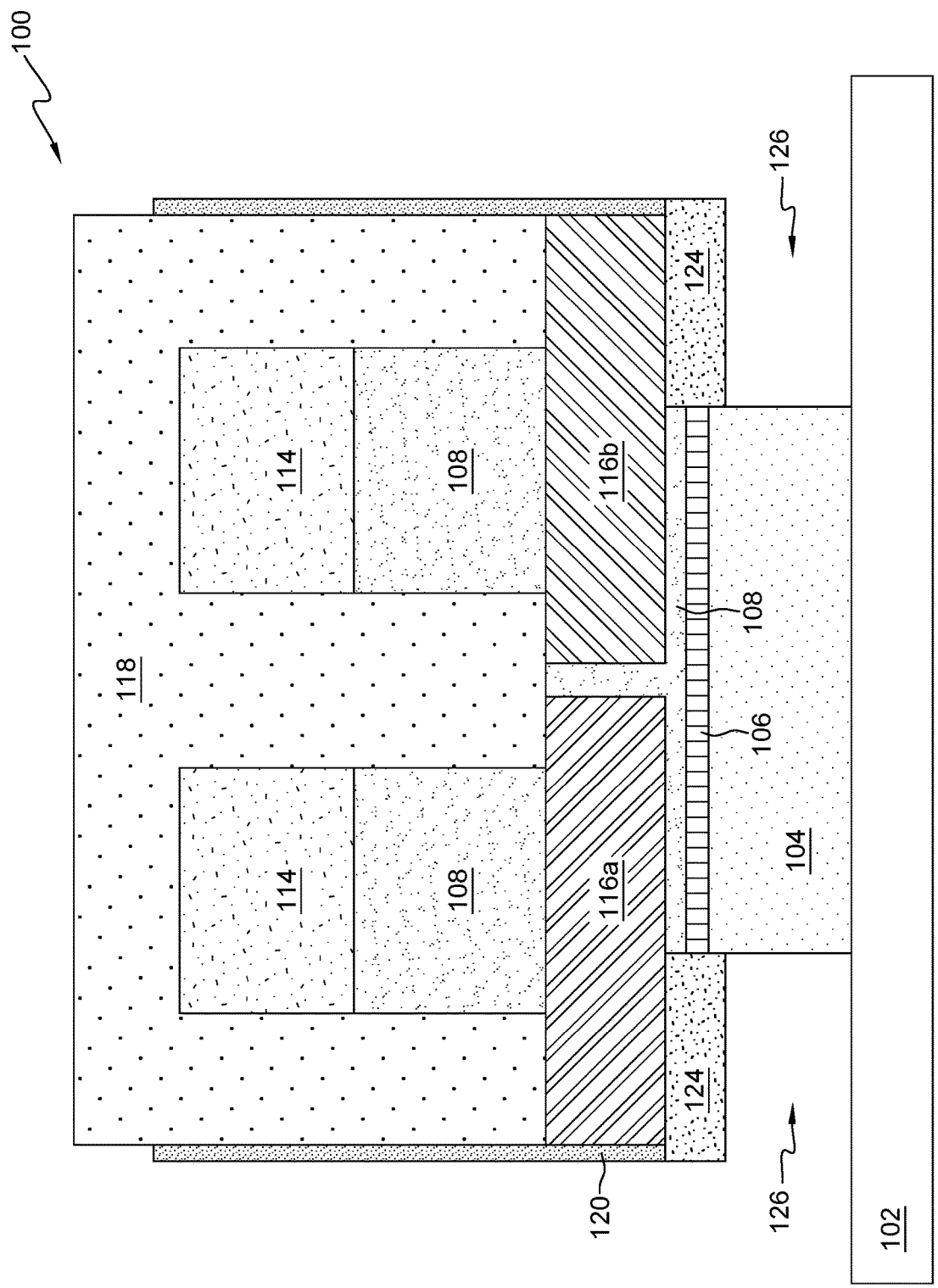
FIG. 6 is a cross section view illustrating the first semiconductor layer recessed in accordance with an embodiment.

Referring now to FIG. 6, the structure 100 with portions of the first semiconductor layer 104 removed is shown, in accordance with an embodiment. Once the first dielectric layer 124 is formed. A selective silicon germanium 30% etching process is performed to laterally remove portions of the first semiconductor layer 104 forming second indentations 126. The exposed sidewalls of the first semiconductor layer 104 are substantially flush with the sidewalls of the second and third semiconductor layers 106, 108. As a result, bottom surfaces of the first dielectric layer 124 are exposed. The second indentations 126 extend laterally substantially the same length as the first dielectric layers 124.

Figure 7:
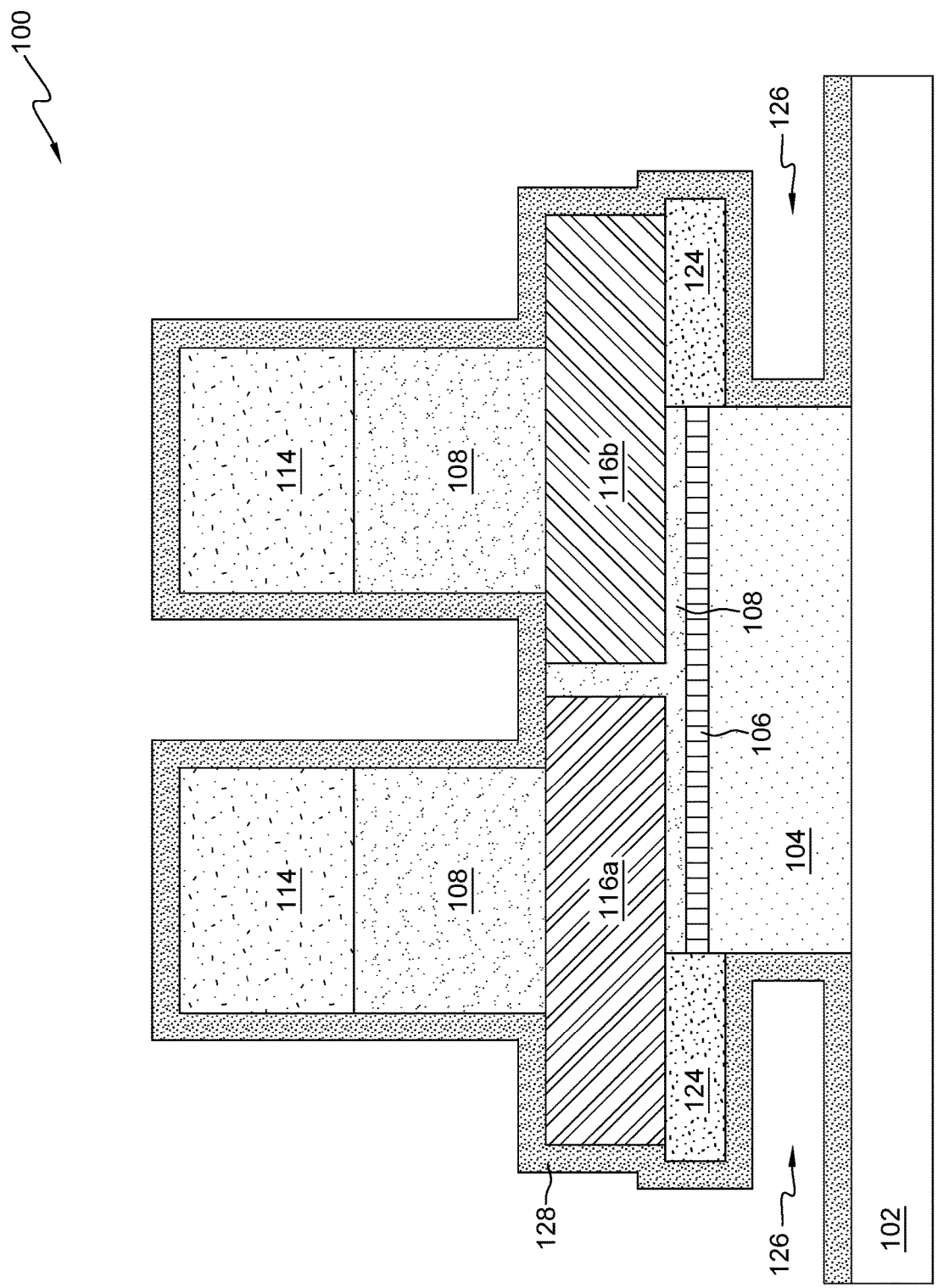
FIG. 7 is a cross section view illustrating a dielectric liner conformally deposited on a top surface of a structure in accordance with an embodiment.

Referring now to FIG. 7, the structure 100 with a dielectric liner 128 is shown, in accordance with an embodiment. After the second indentations 126 are formed, the first OPL 118 is removed thereby exposing the fins 112 and the hard mask cap 114. Any material removal process, such as, for example, ashing may be used to remove the first OPL 118 from the structure 100. Once the first OPL 118 is removed, the dielectric liner 128 is conformally deposited onto the top surface of the structure 100. The dielectric liner 128 may be deposited using any deposition technique, such as, for example, atomic layer deposition. The dielectric liner 128 may be made of insulating material, such as, for example, silicon oxide. The dielectric liner 128 may be thin enough as to not pinch-off the second indentations 126. For example, the dielectric liner 128 may have a thickness ranging from approximately 3 to approximately 8 nm. The dielectric liner 128 and the first dielectric layer 124 may collectively be referred to as a dielectric bi-layer.

Figure 8:
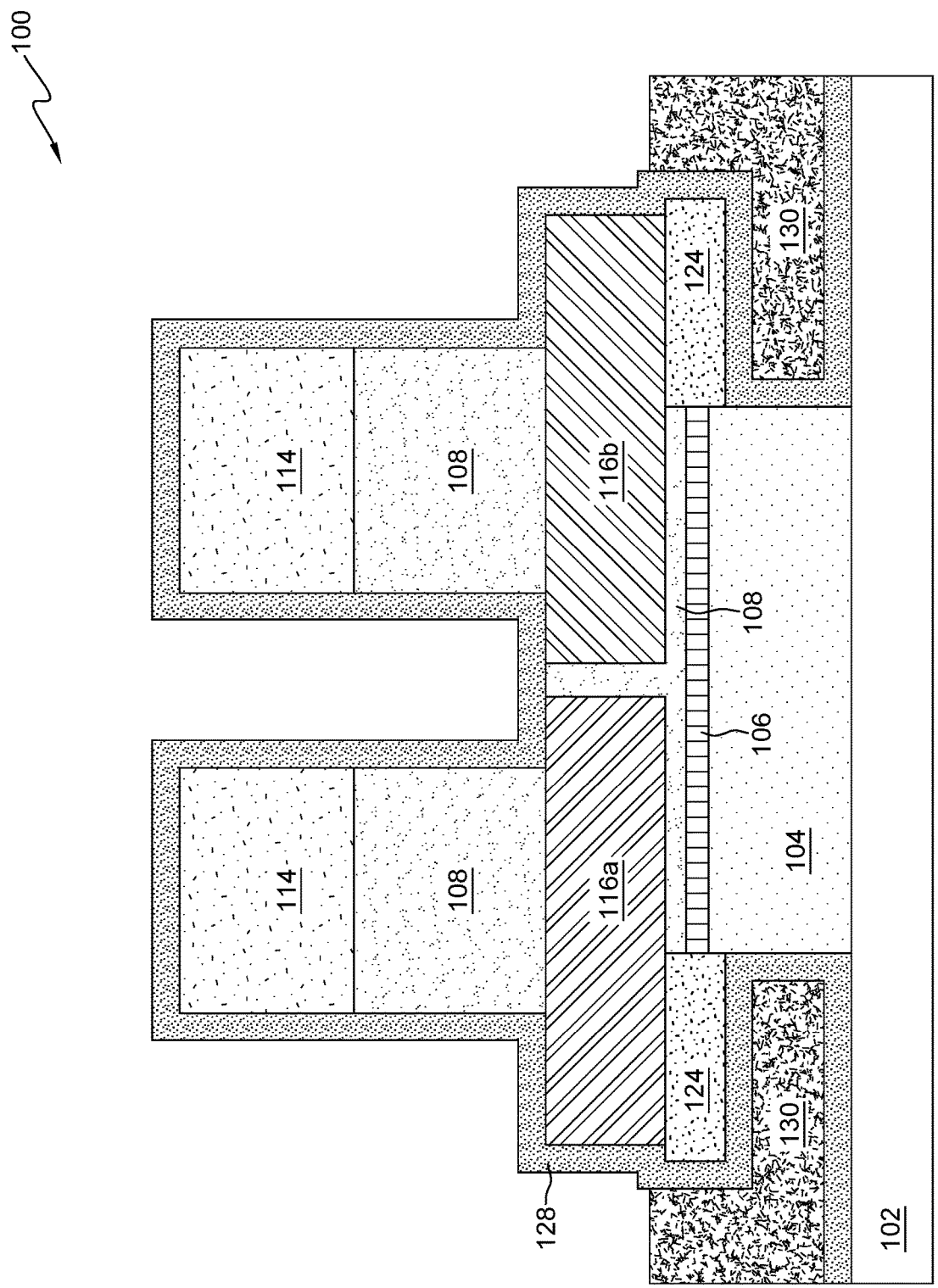
FIG. 8 is a cross section view illustrating second buried power rails directly below the bottom source drains in accordance with an embodiment.

Referring now to FIG. 8, the structure 100 with buried power rails 130 directly below the bottom source drains 116 is shown, in accordance with an embodiment. Once the dielectric liner 128 is conformally deposited onto the top surface of the structure 100, a metal layer (not shown) is deposited onto the structure 100. The metal layer may fill all of the spaces between the vertical fins 112 and the second indentations 126 (illustrated in FIGS. 6-7) below the first dielectric layers 124. The metal layer may be a tungsten metal layer, a ruthenium metal layer, or a cobalt metal layer.

The metal layer is then planarized and recessed, using a CMP and an etch process, such as, for example, a reactive ion etch process, to form the buried power rails 130. The buried power rails 130 are formed within the second indentations 126, illustrated in FIG. 7, and extend above the top surface of the first dielectric layers 124. The buried power rails 130 are surrounded by the dielectric liner 128. The dielectric liner 128 separates the buried power rails 130 from the silicon germanium bi-layer that is adjacent to the buried power rails 130.

Figure 9:
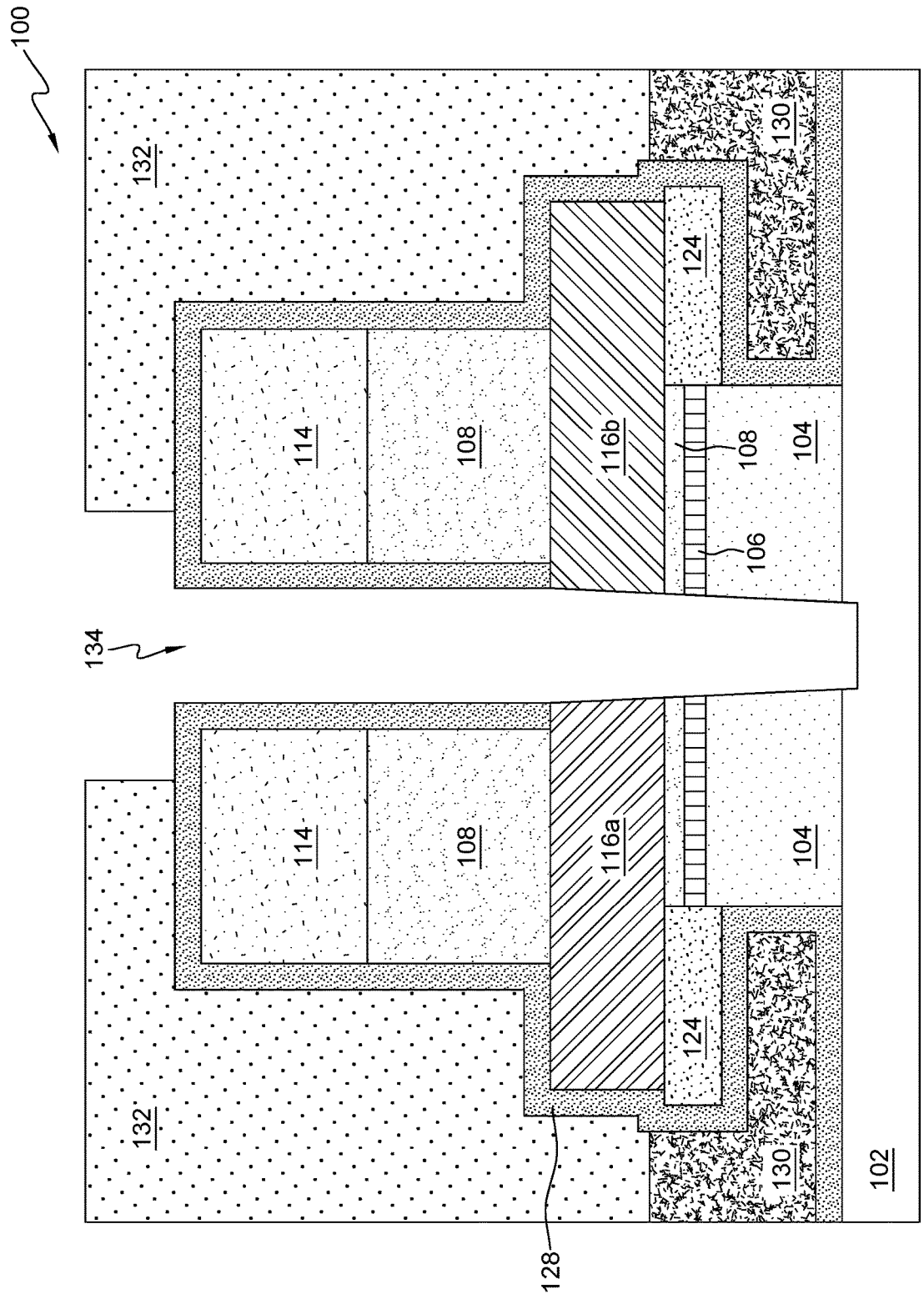
FIG. 9 is a cross section view illustrating a trench between the vertical fins in accordance with an embodiment.

Referring now to FIG. 9, the structure 100 with a trench 134 between the vertical fins 112 is shown, in accordance with an embodiment. A second organic planarization layer (OPL) 132 is deposited onto the top surface of the structure 100. The second OPL 132 may be made of substantially the same material as the first OPL 118. The second OPL 132 protects the structure 100 from damage during subsequent manufacturing processes.

After the second OPL 132 is deposited, an etch process, such as, for example, a reactive ion etch process, may be used to remove portions of the OPL 132 between the two vertical fins 112. Further, the etch process removes portions of the dielectric liner 128, the bottom source drains 116, the third semiconductor layer 108, the second semiconductor layer 106, and the first semiconductor layer 104 between the two vertical fins 112, thereby forming the trench 134. The trench 134 extends vertically from the top surface of the dielectric liner 128 to the exposed top surface of the substrate 102.

Figure 10:
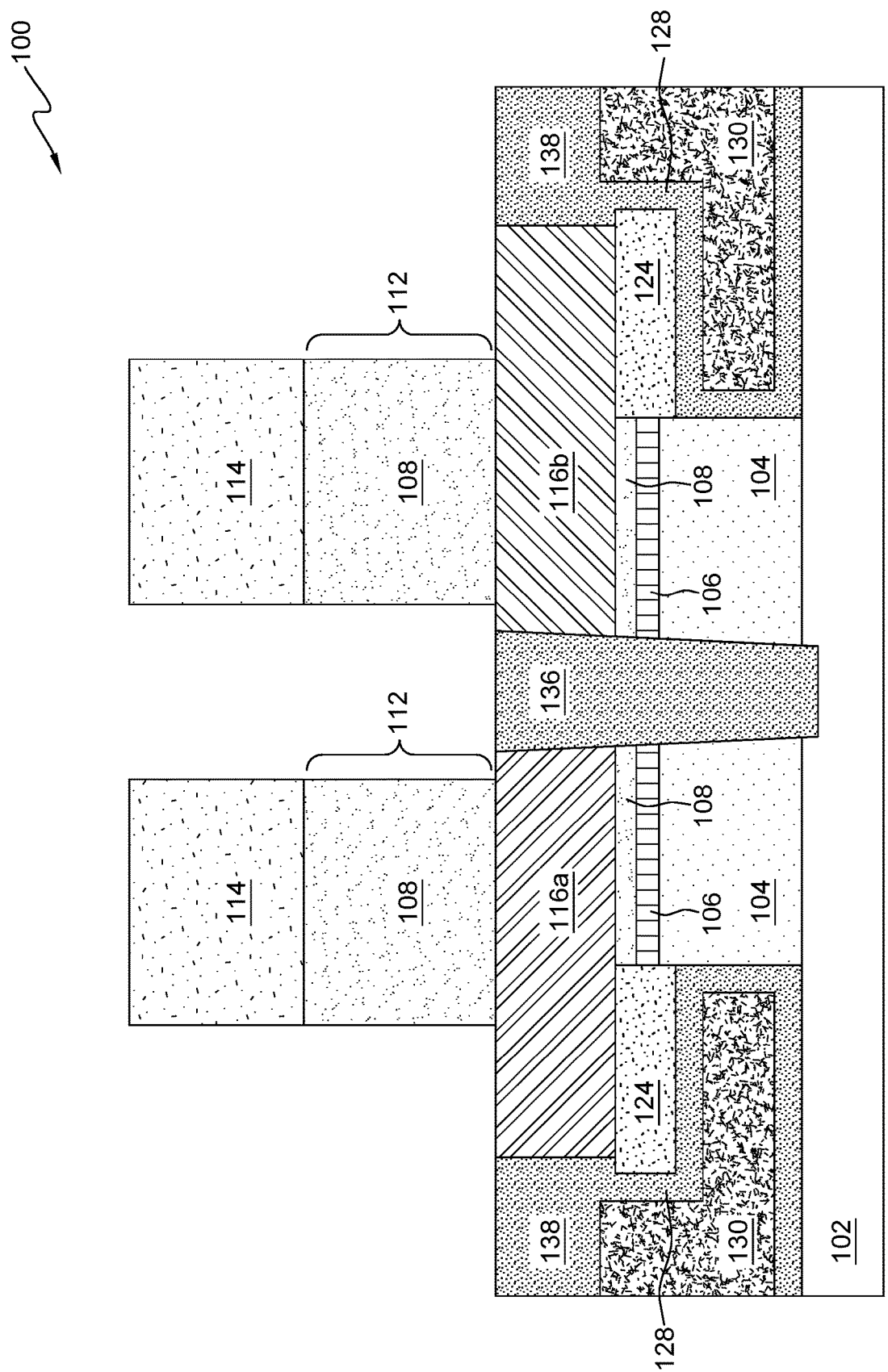
FIG. 10 is a cross section view illustrating a shallow trench isolation between the vertical fins in accordance with an embodiment.

Referring now to FIG. 10, the structure 100 with a shallow trench isolation (STI) 136 between the vertical fins 112 is shown, in accordance with an embodiment. The trench 134 is filled with a dielectric material, forming the STI 136. The STI 136 may be made of an oxide material, such as, for example, silicon oxide. The STI 136 is a form of a dielectric plug that separates the two fins 112 such that electrical current applied to one fin has no effect on the second fin. The top surface of the STI 136 may be substantially flush with a top surface of the bottom source drain 116. Typically, the STI 136 extends through the third semiconductor layer 108, the second semiconductor layer 106, and the first semiconductor layer 104. The STI 136 also extends through a portion of the substrate 102 to a depth that allows for the two fins to be electrically separated.

The oxide material is also deposited on the sides of the fins 112, above the buried power rails 130, forming a second dielectric layer 138. After the STI 136 is formed, the second OPL 132 is removed thereby exposing the fins 112 and the hard mask cap 114. Any material removal process, such as, for example, ashing may be used to remove the second OPL 132 from the structure 100.

Figure 11:
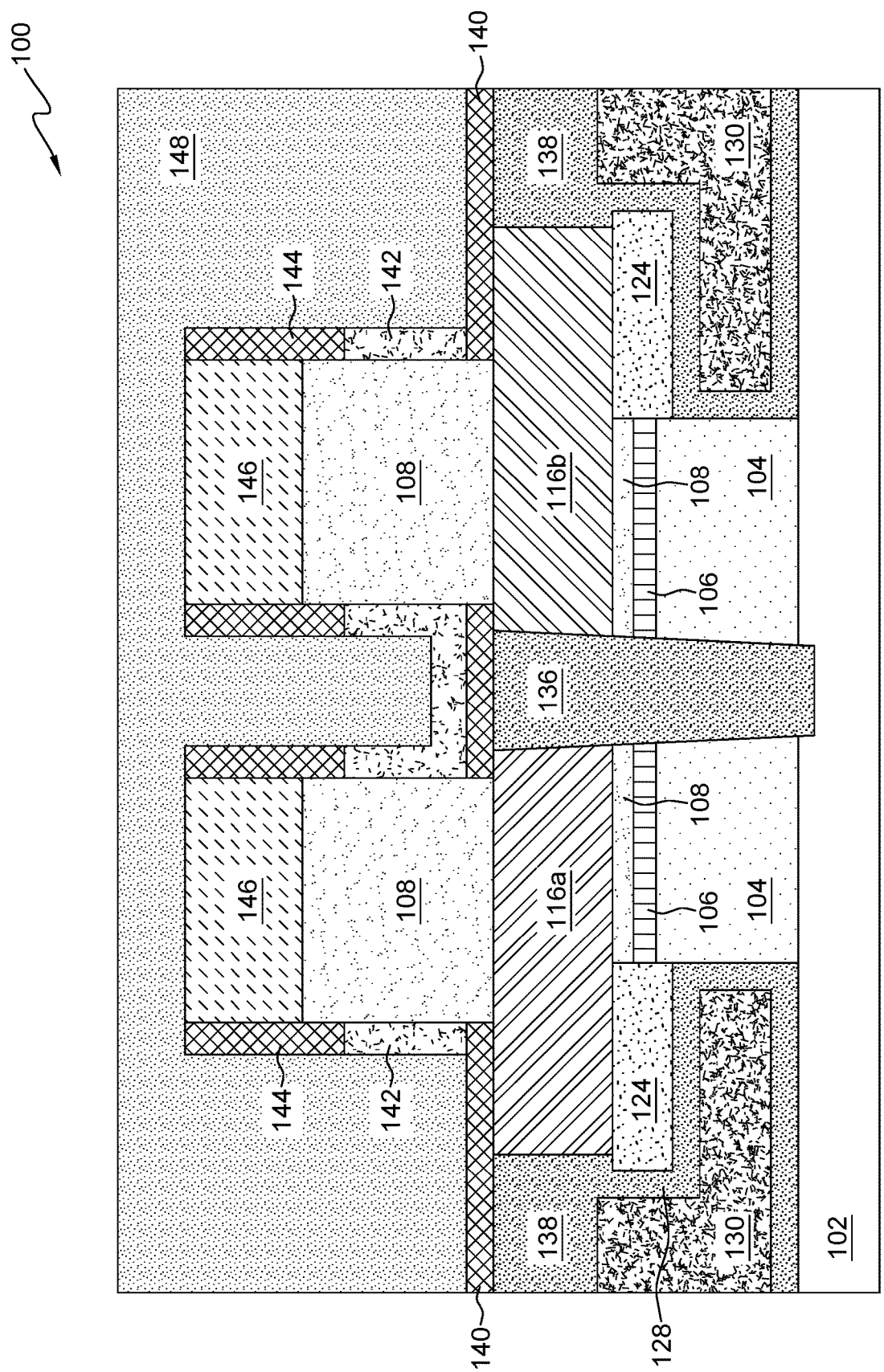
FIG. 11 is a cross section view illustrating top source drains and a metal gate in accordance with an embodiment.

Referring now to FIG. 11, the structure 100 with a metal gate 142, top source drains 146, and an interlayer dielectric (ILD) 148 is shown, in accordance with an embodiment. Once the STI 136 is formed between the two fins 112, the structure 100 undergoes additional manufacturing processes known in the art to form bottom spacers 140, a metal gate 142, top spacers 144, top source drains 146, and the ILD 148. The bottom and top spacers 140, 144 may include dielectric oxides (e.g., silicon oxide), dielectric nitrides (e.g., silicon nitride), dielectric oxynitrides, or any combination thereof. The bottom and top spacers 140, 144 are formed by a deposition process, for example, chemical vapor deposition (CVD) or physical vapor deposition (PVD). The bottom and top spacers 140, 144 may have a thickness of about 3 to about 15 nm, or of about 5 to about 10 nm.

The metal gate 142 may include a gate dielectric material, a work function metal, and a metal gate. The gate dielectric material may include oxides, nitrides, oxynitrides, silicates (e.g., metal silicates), aluminates, titanates, nitrides, high-k dielectrics like hafnium oxide, or any combination thereof. The work function metal include p-type work function metal materials and n-type work function metal materials. P-type work function materials include compositions such as ruthenium, palladium, platinum, cobalt, nickel, titanium nitride, titanium carbide, titanium aluminum carbide, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, titanium nitride, titanium carbide, titanium aluminum carbide, or any combination thereof. The metal gate may be made of conductive metal such as, for example, aluminum (Al), platinum (Pt), gold (Au), tungsten (W), titanium (Ti), or any combination thereof. The metal gate 142 may be deposited by a suitable deposition process, for example, atomic layer deposition, chemical vapor deposition, plasma-enhanced chemical vapor deposition, physical vapor deposition, plating, thermal or e-beam evaporation, and sputtering.

After the formation of the metal gate 142, the ILD 148 is deposited on the structure 100. The ILD 148 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 148 is deposited by a deposition process, including, but not limited to chemical vapor deposition, physical vapor deposition, plasma enhanced chemical vapor deposition, atomic layer deposition, evaporation, chemical solution deposition, or like processes. To form the top source drains 146, the hard mask caps 114 are first removed. The hard mask caps 114 may be removed by utilizing any material removal process, such as, for example, chemical mechanical polishing followed by selective SiN removal. Once the hard mask caps 114 are removed, exposing the top surfaces of the third semiconductor layer 108, the top source drains 146 are epitaxially grown from the exposed top surfaces of the third semiconductor layer 108. The top source drains 146 may be doped with the same type of dopants as the bottom source drains 116.

Figure 12:
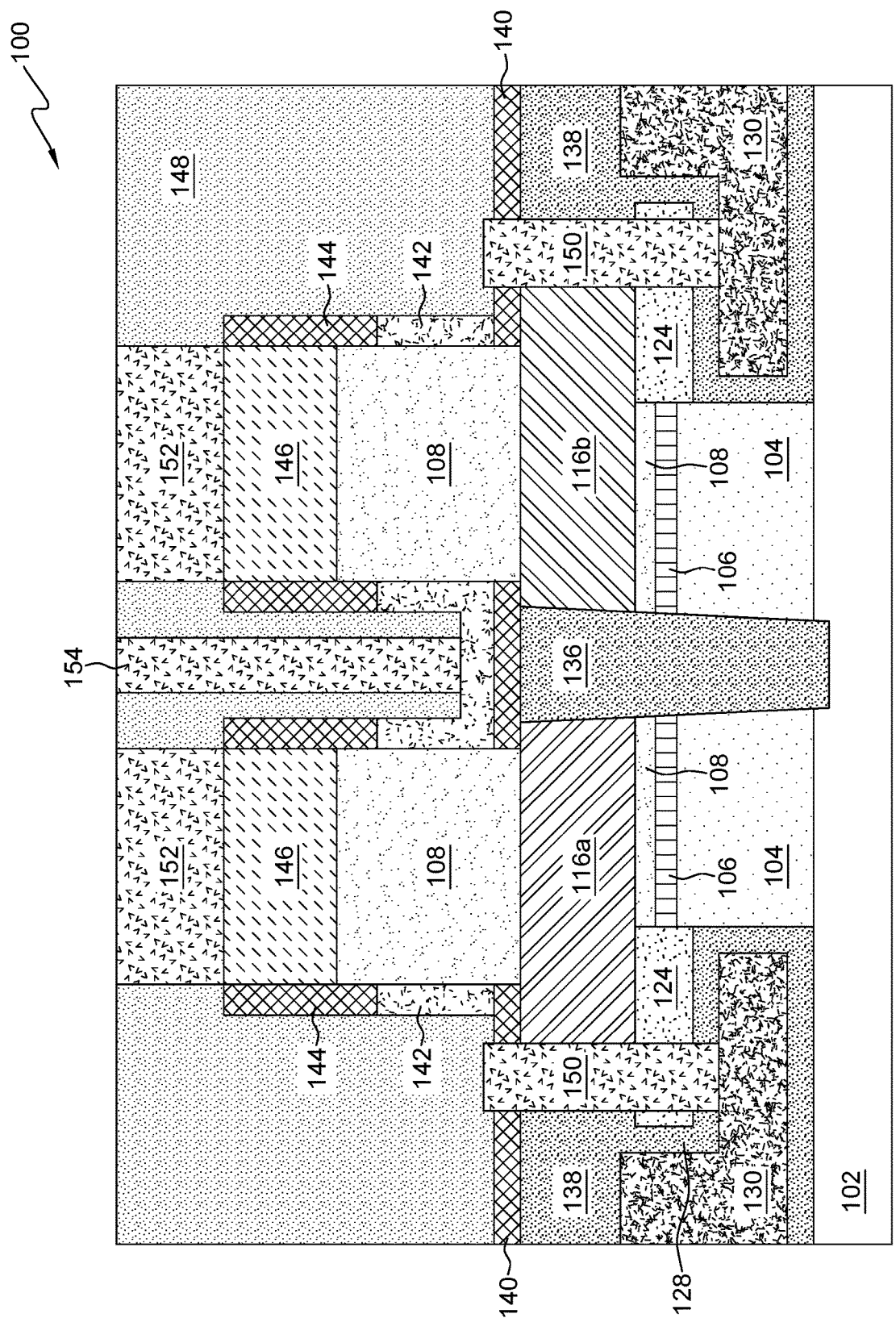
FIG. 12 is a cross section view illustrating bottom source drain contacts, top source drain contacts, and a gate contact in accordance with an embodiment.
Figure 13:
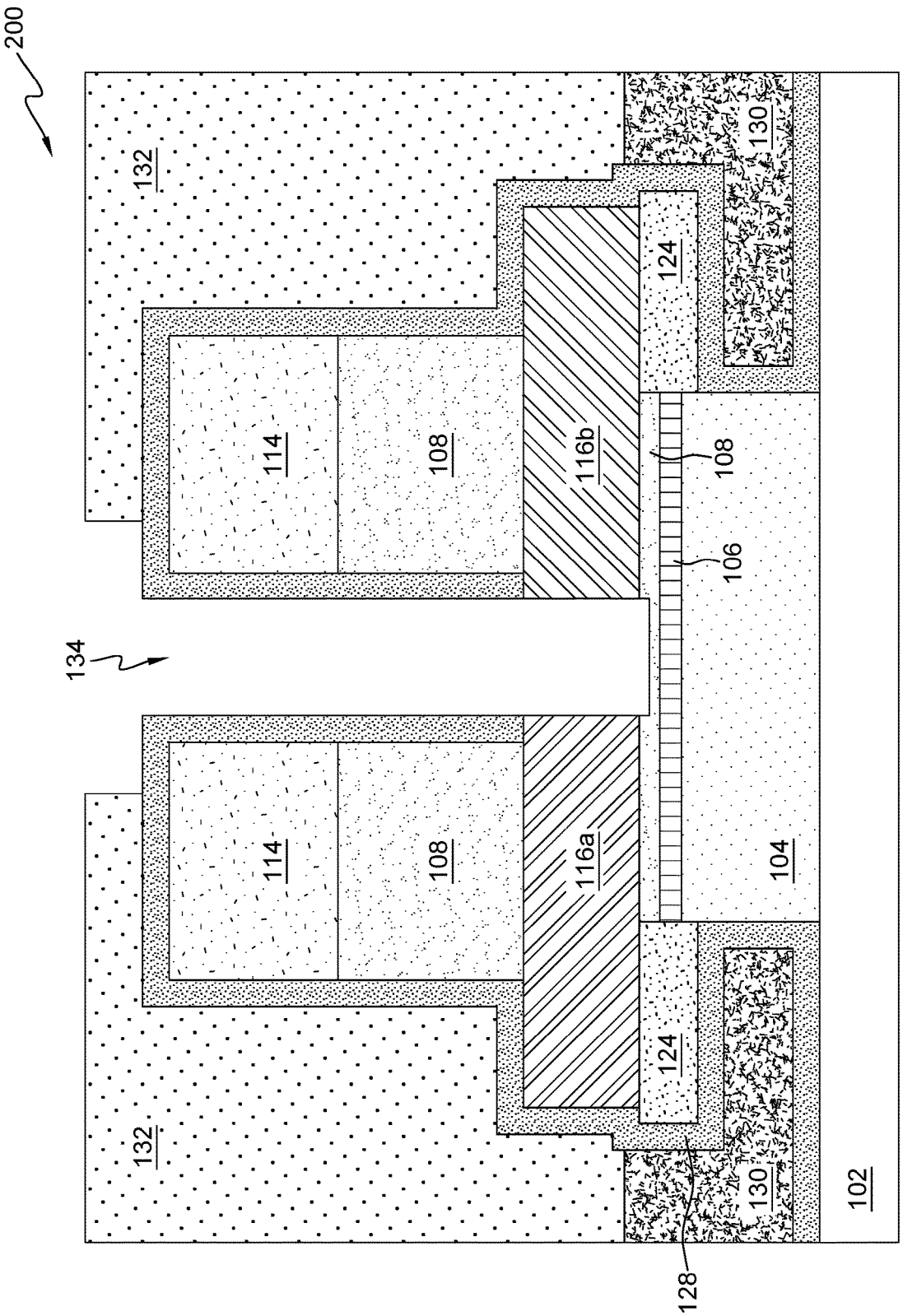
FIG. 13 is a cross section view illustrating a trench between the vertical fins in accordance with an embodiment.

Referring now to FIG. 12, the structure 100 with bottom source drain contacts 150, top source drain contacts 152, and a gate contact 154 is shown, in accordance with an embodiment. The bottom source drain contacts 150 extend from the bottom portions of the ILD 148, through the bottom source drains 116, the first dielectric layer, the dielectric liner 128 to the buried power rails 130. The bottom source drain contacts 150 are formed within contact trenches. To form the contact trenches a resist, such as a photoresist, may be deposited and patterned. An etch process, such as reactive ion etch, may be performed using the patterned resist as an etch mask to remove portions of the ILD 148, the bottom source drains 116, the first dielectric layer, and the dielectric liner 128 until the buried power rails 130 are exposed. The contact trenches are then filled with a conductive material such as, for example, aluminum (Al), platinum (Pt), gold (Au), tungsten (W), titanium (Ti), cobalt (Co), ruthenium (Ru), or any combination thereof. The conductive material may be deposited by a suitable deposition process, for example, chemical vapor deposition, plasma enhanced chemical vapor deposition, physical vapor deposition, plating, thermal or e-beam evaporation, or sputtering. The conductive material is then recessed, using an etch process, to form the bottom source drain contacts 150. The recessed portion of the contact trenches are then filed with the ILD 148, using known deposition techniques.

In addition to the bottom source drain contacts 150, the structure 100 undergoes further manufacturing processes to form the top source drain contacts 152 and the gate contact 154. The top source drain contacts 152 and the gate contacts 154 are formed in substantially the same manner as the bottom source drain contacts 150. The top source drain contacts 152 extend through the ILD 148 to the top source drains 146. The gate contacts 154 extend through the ILD 148 to the metal gate 142.

The resultant structure 100, as illustrated in FIG. 12, includes two VTFETs separated by the STI 136. The VTFET on the left is a p-type FET whereas the VTFET on the right is an n-type FET. In addition, each VTFET includes the buried power rail 130. The buried power rails 130 are directly below the VTFET. Further, the buried power rails 130 are connected with the bottom source drains 116 through the bottom source drain contacts 150.

Another embodiment by which to fabricate a VTFET with a buried power rail directly below it is described in detail below by referring to the accompanying FIGS. 13-17. In the present embodiment, the first and second semiconductor layers 104, 106 are completely removed and the STI 136 spans the area between the two buried power rails 130.

Referring now to FIG. 13, a structure 200 is shown at an intermediate step of fabrication after depositing the second OPL 132 (as described above with respect to FIG. 9), in accordance with an embodiment of the present invention. The structure 200 may be substantially similar in all respects to the structure 100 described in detail above with respect to FIG. 9; however, in the present embodiment, the structure 200 includes the trench 134 which does not extend to the substrate 102. Beginning with the structure 100 of FIG. 9, a reactive ion etch process is performed to form the trench 134 between the two fins 112. The reactive ion etch process ends when a top surface of the third semiconductor layer 108 is exposed. As a result, the trench 134 extends from the top surface of the dielectric liner 128 to the top surface of the third semiconductor layer 108.

Figure 14:
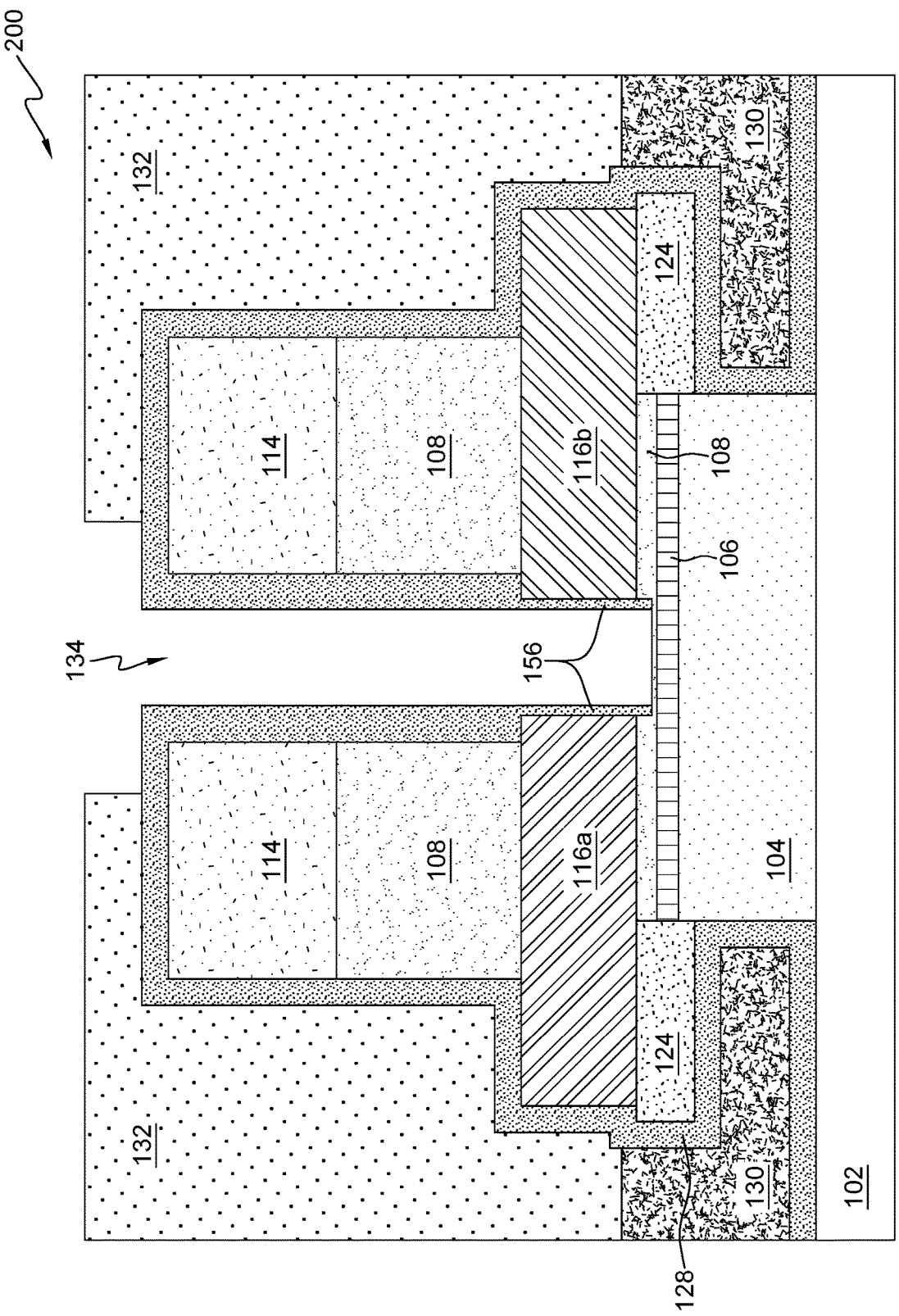
FIG. 14 is a cross section view illustrating a liner along the sidewalls of the bottom source drains in accordance with an embodiment.

Referring now to FIG. 14, the structure 200 with a second liner 156 on sidewalls of the trench 134 is shown, in accordance with an embodiment. By forming the trench 134, sidewalls of the bottom source drains 116 are exposed. The second liner 156 is then deposited onto the exposed sidewalls of the bottom source drains 116. The second liner 156 may be made of material that is substantially the same as the material that makes up the dielectric liner 128. The second liner 156 protects the bottom source drains 116 from damage during subsequent fabrication steps. The second liner 156 extends the entire length of the sidewalls of the trench 134.

Figure 15:
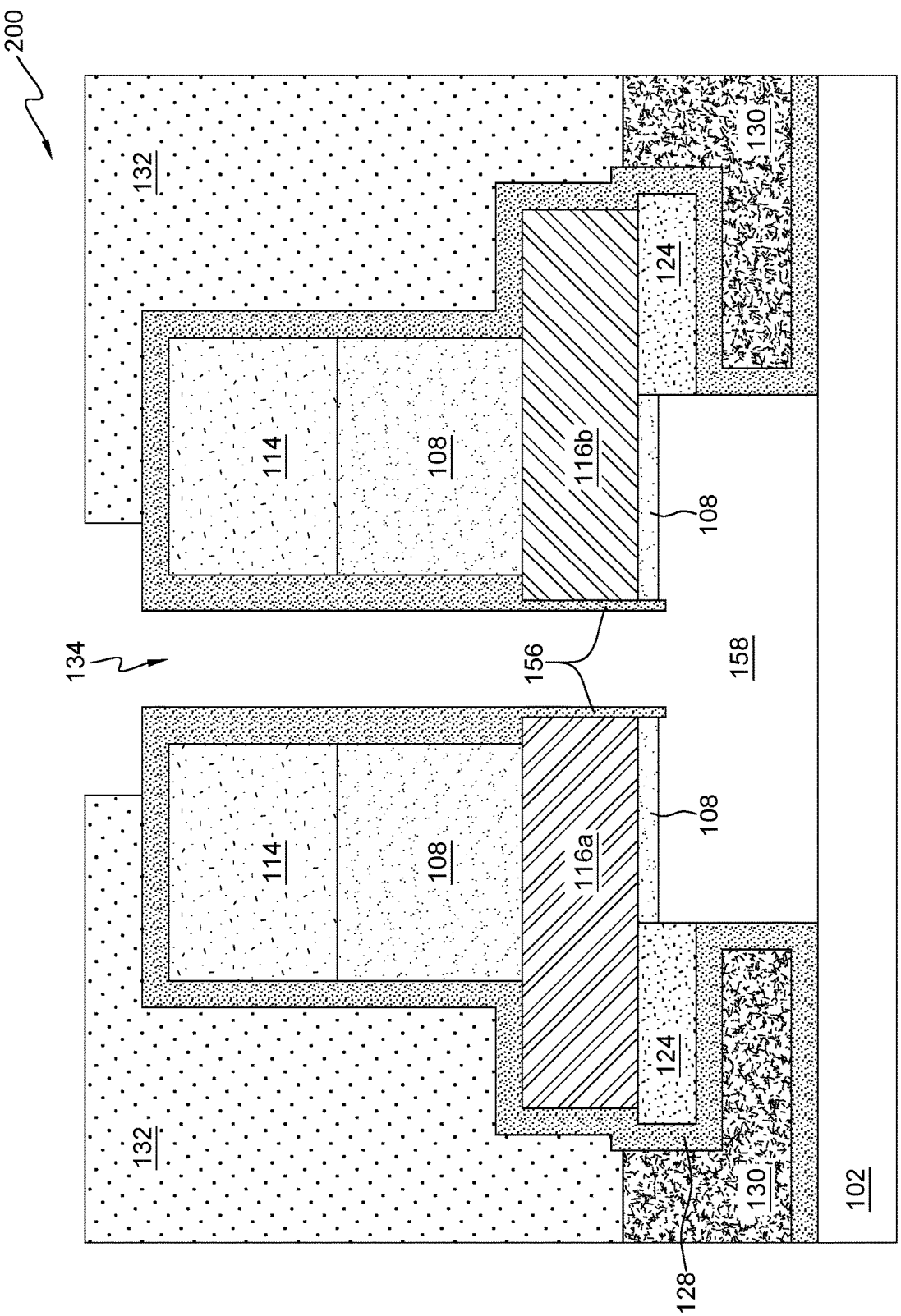
FIG. 15 is a cross section view illustrating a structure with the first and second semiconductor layers removed in accordance with an embodiment.
Figure 16:
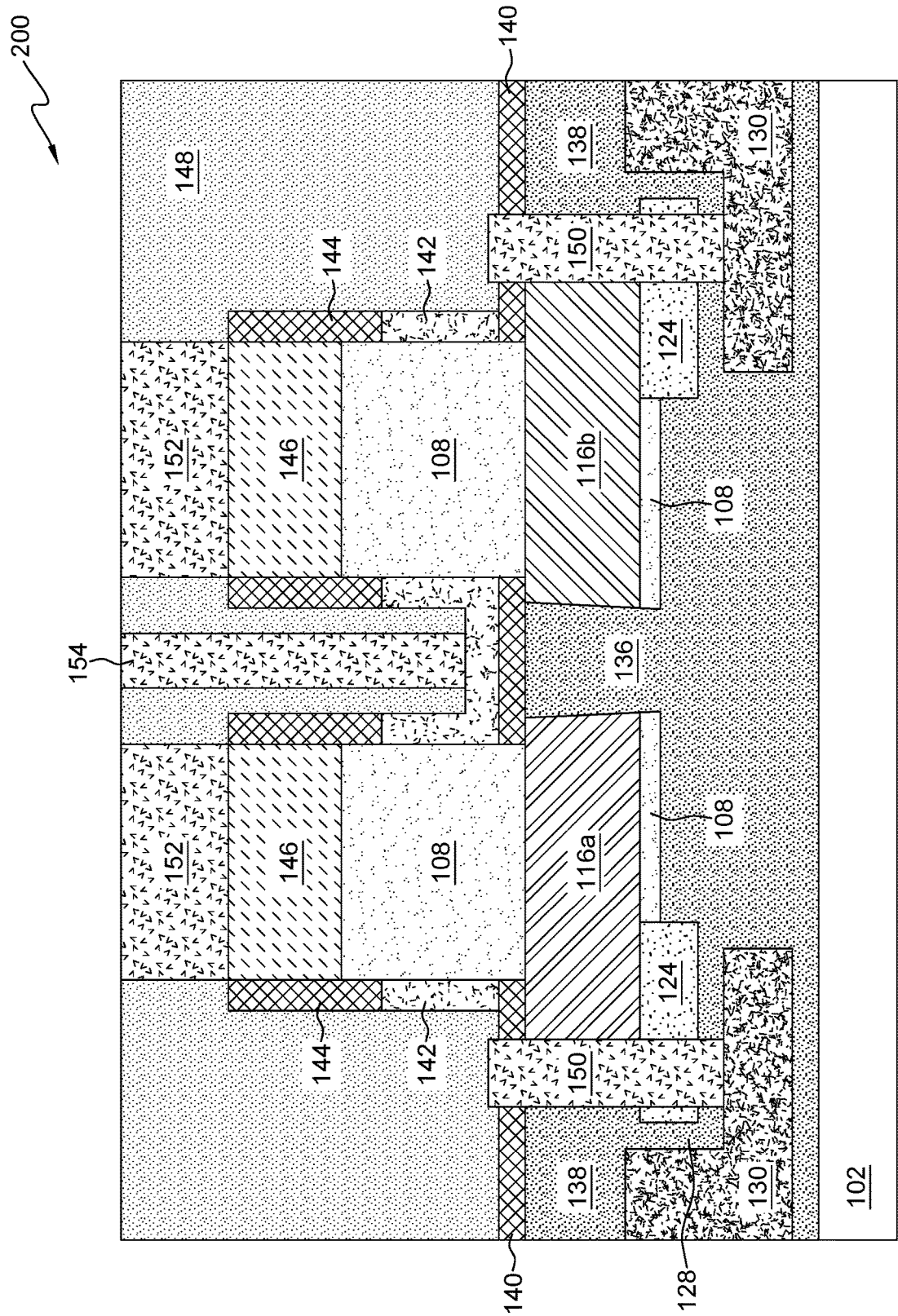
FIG. 16 is a cross section view illustrating a structure with buried power rails, bottom source drain contacts, top source drain contacts, and a gate contact in accordance with an embodiment.

Referring now to FIG. 15, the structure 200 with the first and the second semiconductor layers 104, 106 removed is shown, in accordance with an embodiment. After the second liner 156 is deposited onto the sidewalls of the trench 134, a selective silicon germanium etch process, such as, for example, vapor phased HCl dry etch is used to remove the first and the second semiconductor layers 104, 106, creating an opening 158 and exposing the top surface of the substrate 102. The etch process is selective (will not substantially remove) to the substrate 102. The etch process does not remove or damage the bottom source drains 116 because they are protected by the second liner 156.

After the first and the second semiconductor layers 104, 106 are removed, the resultant opening 158 is then filled with an oxide material, such as, for example, silicon oxide to create the STI 136. The STI 136 separates the two fins 112 and the two bottom source drains 116 such that electrical current applied to one fin has no effect on the second fin. Typically, the STI 136 extends through a portion of the substrate 102 to a depth that allows for the two fins to be electrically separated.

Referring now to FIG. 16, the structure 200 with buried power rails 130, bottom source drain contacts 150, top source drain contacts 152, and the gate contact 154 is shown, in accordance with an embodiment. Once the STI 136 is formed, the structure 200 undergoes additional fabrication processing described herein with respect to FIGS. 10-12.

The resultant structure 200, as illustrated in FIG. 16, includes two VTFETs separated by the STI 136. In an embodiment, the two VTFETs may be of the same type, such as, p-type VTFET or n-type VTFET. In an alternative embodiment, the VTFETs are of different type. For example, one VTFET is p-type while the other is n-type. Further, the STI 136 extends vertically from the bottom surface of the bottom spacer 140 to the top surface of the substrate 102. The STI 136 extends laterally between the two buried power rails 130. The structure 200 is substantially similar to the structure 100 because both structures include buried power rails 130 directly below the VTFETs. However, the structure 100 includes portions of the first and second semiconductor layers 104, 106 directly below the STI 136 and the bottom source drains 116. It should be appreciated that even though two VTFETs and two buried power rails 130 are illustrated, embodiments of the present invention contemplate forming a plurality of VTFETs and a plurality buried power rails 130 on a single substrate wafer.

Figure 17:
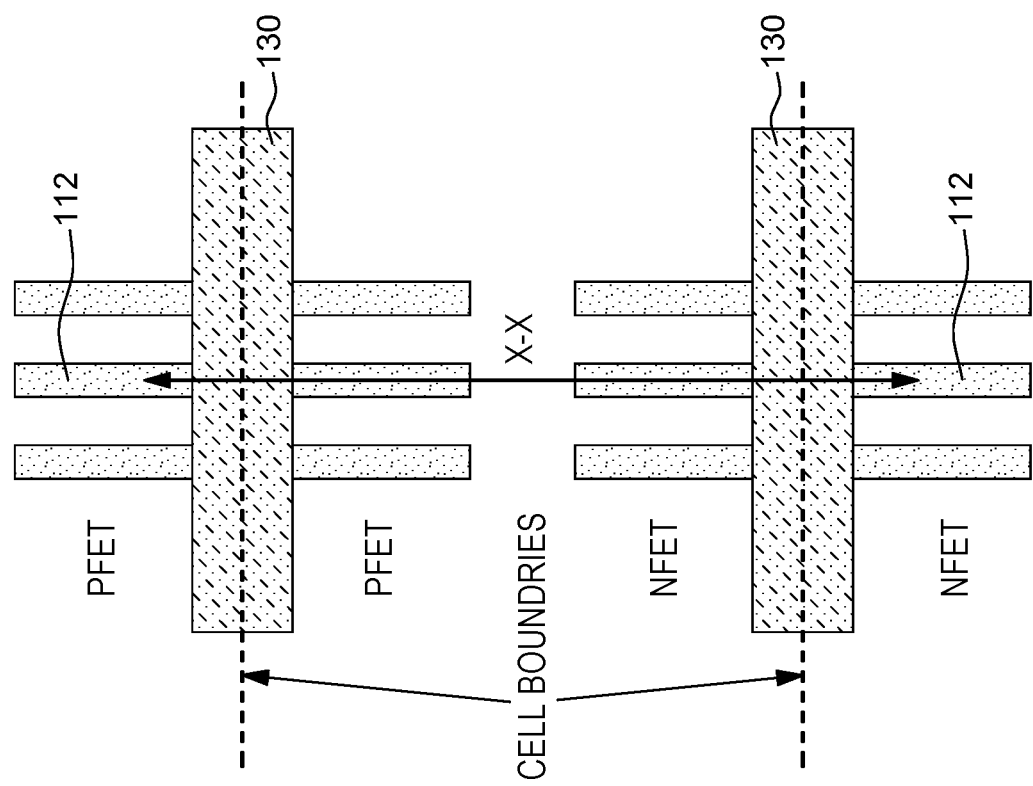
FIG. 17 is a top view illustrating vertical transport field effect transistors with their respective buried power rails in accordance with an embodiment.

Referring now to FIG. 17, a plurality of VTFETs and their respective buried power rails 130 are shown, in accordance with an embodiment. The top two VTFETs are a p-type VTFETs, while the bottom two VTFETs are an n-type VTFETs. Further, FIGS. 1-16 illustrate cross-section views of the fins 112 taken along section line X-X. The cell boundaries, delineated by the dashed lines, represents the boundaries of the structure 100 and the structure 200 illustrated in FIGS. 1-16.

As is illustrated in FIG. 17, the buried power rails 130 are formed directly below the VTFETs. Having the buried power rails 130 directly below the VTFETs as opposed to either on top of the VTFETs or in the STI 136 region between the VTFETs allows for more VTFETs to be fabricated in the same footprint. Further, since the buried power rails 130 form a direct contact with the bottom source drains 116, formation of an additional bottom source drain contact is not necessary. This is advantageous because it does not increase the footprint.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a buried power rail under a bottom source drain of a vertical transistor;
   a dielectric bi-layer under the bottom source drain, the dielectric bi-layer is between the buried power rail and the bottom source drain;
   a silicon germanium bi-layer under the bottom source drain, the silicon germanium bi-layer is adjacent to the buried power rail; and
   a buried power rail contact, the buried power rail contact connects the bottom source drain to the buried power rail.

2. The semiconductor structure of claim 1, wherein the dielectric bi-layer comprises:
   a first dielectric layer, the first dielectric layer is in direct contact with the bottom source drain; and
   a dielectric liner, the dielectric liner surrounds the buried power rail.

3. The semiconductor structure of claim 2, wherein the dielectric liner isolates the buried power rail from the silicon germanium bi-layer.

4. The semiconductor structure of claim 1, wherein the silicon germanium bi-layer comprises:
   a first semiconductor layer; and
   a second semiconductor layer disposed on the first semiconductor layer, the second semiconductor layer is in direct contact with the first semiconductor layer.

5. The semiconductor structure of claim 4, wherein the first semiconductor layer includes 30% germanium and the second semiconductor layer includes 60% germanium.

6. The semiconductor structure of claim 1, further comprising:
   a third semiconductor layer, the third semiconductor layer is directly below the bottom source drain, the third semiconductor layer is made of silicon.

7. The semiconductor structure of claim 1, further comprising:
   a top source drain;
   a fin, the fin is between the top source drain and the bottom source drain; and
   a metal gate, the metal gate is adjacent and in direct contact with the fin.

8. The semiconductor structure of claim 1, wherein the buried power rail is made of tungsten or ruthenium.

9. A semiconductor structure comprising:
   a buried power rail under a bottom source drain of a vertical transistor;
   a dielectric bi-layer under the bottom source drain, the dielectric bi-layer is between the buried power rail and the bottom source drain; and
   a buried power rail contact, the buried power rail contact connects the bottom source drain to the buried power rail.

10. The semiconductor structure of claim 9, wherein the dielectric bi-layer comprises:
    a first dielectric layer, the first dielectric layer is in direct contact with the bottom source drain; and
    a dielectric liner, the dielectric liner surrounds the buried power rail.

11. The semiconductor structure of claim 9, further comprising:
    a top source drain;
    a fin, the fin is between the top source drain and the bottom source drain; and
    a metal gate, the metal gate is adjacent and in direct contact with the fin.

12. The semiconductor structure of claim 9, further comprising:
    a semiconductor layer, the semiconductor layer is directly below the bottom source drain, the semiconductor layer is made of silicon.

13. The semiconductor structure of claim 9, wherein the buried power rail is made of tungsten or ruthenium.

14. A method comprising:
    epitaxially growing a silicon germanium bi-layer on a substrate, the silicon germanium bi-layer includes a first semiconductor layer and a second semiconductor layer;

epitaxially growing a third semiconductor layer on the silicon germanium bi-layer;

forming one or more vertical fins and one or more bottom source drains within the third semiconductor layer, the one or more bottom source drains are below the one or more vertical fins;

laterally etching portions of the silicon germanium bi-layer and the third semiconductor layer to form one or more first indentations;

forming a first dielectric layer within the one or more indentations, the first dielectric layer is directly below the one or more bottom source drain;

laterally etching portions of the first semiconductor layer to form one or more second indentations;

depositing a dielectric liner within the one or more second indentations; and forming one or more buried power rails within the one or more second indentations, the one or more buried power rails are directly below the one or more bottom source drains.

15. The method of claim 14, wherein the dielectric liner separates the one or more buried power rails from the first dielectric layer.

16. The method of claim 14, further comprising:
forming a shallow trench isolation between the one or more vertical fins; and
forming one or more bottom source drain contacts, the one or more bottom source drain contacts connects the one or more bottom source drains with the one or more buried power rails.

17. The method of claim 16, wherein the shallow trench isolation extends through the third semiconductor layer, the silicon germanium bi-layer, and a portion of the substrate.

18. The method of claim 14, further comprising:
forming one or more top source drains on top of the one or more fins;
forming a metal gate between the one or more fins;
forming one or more top source drain contacts; and
forming one or more gate contacts.

19. The method of claim 14, wherein the first semiconductor layer includes 30% germanium and the second semiconductor layer includes 60% germanium.

20. The method of claim 14, wherein the third semiconductor layer is made of silicon.

* * * * *